(12) United States Patent
Pei et al.

(10) Patent No.: US 6,230,789 B1
(45) Date of Patent: May 15, 2001

(54) HEAT DISSIPATING DEVICE AND METHOD MAKING THE SAME

(75) Inventors: Hsien-Sheng Pei; Eric Su; Stanley Chen; Ken Lee, all of Taipei (TW)

(73) Assignee: Foxconn Precision Componment Co., LTD, Taipei Hsien (TW)

( * ) Notice: Subject to any disclaimer, the term of this patent is extended or adjusted under 35 U.S.C. 154(b) by 0 days.

(21) Appl. No.: 09/344,824

(22) Filed: Jun. 25, 1999

(30) Foreign Application Priority Data

Jul. 8, 1998 (TW) ................................................ 87111025

(51) Int. Cl.[7] ........................................................ F28F 7/00
(52) U.S. Cl. ...................... 165/80.3; 165/185; 257/706; 257/722; 174/16.3; 361/703; 361/697; 361/709; 29/890.03
(58) Field of Search ............................. 165/80.3, 104.33, 165/185; 361/703, 704, 710, 697; 257/718, 706, 722; 29/890.03; 174/16.3

(56) References Cited

U.S. PATENT DOCUMENTS

| | | | |
|---|---|---|---|
| 4,546,405 | * | 10/1985 | Hultmark et al. .................. 165/80.3 |
| 5,168,926 | * | 12/1992 | Watson et al. ....................... 165/185 |
| 5,381,859 | * | 1/1995 | Minakami et al. ................. 165/80.3 |
| 5,710,733 | * | 1/1998 | Chengson et al. .................... 361/704 |
| 5,838,064 | * | 11/1998 | Shimada et al. ...................... 257/718 |
| 5,870,285 | * | 2/1999 | Kosteva et al. ....................... 361/704 |
| 5,880,930 | * | 3/1999 | Wheaton ............................... 361/704 |
| 5,894,882 | * | 4/1999 | Kikuchi et al. ...................... 165/80.3 |
| 5,897,917 | * | 4/1999 | Hinshaw et al. ...................... 165/185 |
| 5,969,949 | * | 10/1999 | Kim et al. ............................. 361/704 |
| 5,969,950 | * | 10/1999 | Tantoush .............................. 361/704 |

* cited by examiner

Primary Examiner—Ira S. Lazarus
Assistant Examiner—Terrell McKinnon
(74) Attorney, Agent, or Firm—Wei Te Chung

(57) ABSTRACT

The present invention provides a heat dissipating device and a method for making the same. The heat dissipating device includes an aluminum flat base plate integrally forming a number of studs thereon, an aluminum folded fin with a number of inverted U-shaped heat dissipating fins connecting with each by bottom partitions. Each partition defines a number of holes. Thermal grease is uniformly spread on a bottom of each partition. In manufacturing the heat dissipating device, the folded fin is firstly mounted to the base plate to a position that the studs extend through the holes in the partitions. The studs are then subject to pressing operation to fixedly connect the folded fin and the base plate together, whereby the thermal grease entirely fill the gaps between the partitions and the base plate to enable heat absorbed by the base plate to be effectively dissipated by the inverted U-shaped heat dissipating fins.

13 Claims, 9 Drawing Sheets

HEAT DISSIPATING DEVICE AND METHOD MAKING THE SAME

BACKGROUND OF THE INVENTION

1. Field of The Invention

The present invention is related to a heat dissipating device, and particularly to a heat dissipating device for a computer, wherein the device includes a folded fin fixed to a base plate.

As the operation speed of a central processing unit (CPU) of a computer becomes faster and faster, heat generated by the operating CPU needs to be timely dissipated; otherwise, a malfunction or a unstableness of the CPU will happen. To solve this problem, a heat dissipating device is proposed to be attached to a top of the CPU thereby absorbing the heat generated by the CPU and transmitting it to a surrounding environment.

Presently, there are two types of heat dissipating device; the first type is made by aluminum extrusion to get a blank; the blank is then subject to a sawing process to get a number of pin fins on the heat dissipating device. Such a heat dissipating device has disadvantages that it is heavy, needs a complicated machining process and generates a bulk of wasted material.

The second type is made by first folding an aluminum sheet to get a folded fin; the folded fin is attached to a base plate by epoxy. Such a heat dissipating device has a disadvantage that since the epoxy needs a relatively long time to cure, the device needs a corresponding long period to be manufactured, which is not economical. Secondly, epoxy is expensive, which causes the cost of the heat dissipating device to be correspondingly high. Finally, epoxy will deteriorate after a period of use. When this happens, the bonding strength achieved by the epoxy is lowered.

Hence, an improved heat dissipating device is needed to eliminate the above mentioned defects of current heat dissipating devices.

SUMMARY OF THE INVENTION

A first objective of the present invention is to provide a low-cost and light heat dissipating device, wherein during the manufacturing of the heat dissipating device, almost no wasted material will be generated.

A second objective of the present invention is to provide a heat dissipating device which has a folded fin that can be quickly and securely fixed to a base plate.

A further objective of the present invention is to provide a method for manufacturing a heat dissipating device having the above advantages.

To fulfill the above mentioned objectives, according to one embodiment of the present invention, a heat dissipating device includes a flat base plate integrally formed with a number of studs thereon. A folded fin is attached to the base plate. The folded fin has a number of inverted U-shaped heat dissipating fins connecting with each other by a number of horizontal partitions. Each partition defines a number of holes fittingly received corresponding studs. A top end of each stud is pressed to fixedly connect the base plate and the partitions together whereby the folded fin and the base plate are fixedly connected with each other. Thermal grease fills-gaps between the partitions and the base plate, whereby heat absorbed by the base plate from a CPU can be effectively transmitted to the folded fin and finally to a surrounding environment through the folded fin.

The present invention also provides a method for manufacturing a heat dissipating device, the method comprising the following steps:

forming a corrugated folded fin having a number of inverted U-shaped heat dissipating fins connecting with each other by horizontal bottom partitions;

forming a number of holes in each of the partitions;

spreading thermal grease on a bottom face of each of the partitions;

forming a flat base plate with a number of studs thereon;

mounting the folded fin to the base plate to a position where the studs extend through the holes in the partitions; and pressing the studs to cause the partitions and the base plate to fixedly connect together, wherein the thermal grease fills air gaps between the base plate and the partitions so that the folded fin is tightly connected with the base plate.

DETAILED DESCRIPTION OF THE PREFERRED EMBODIMENT

Figure 1:
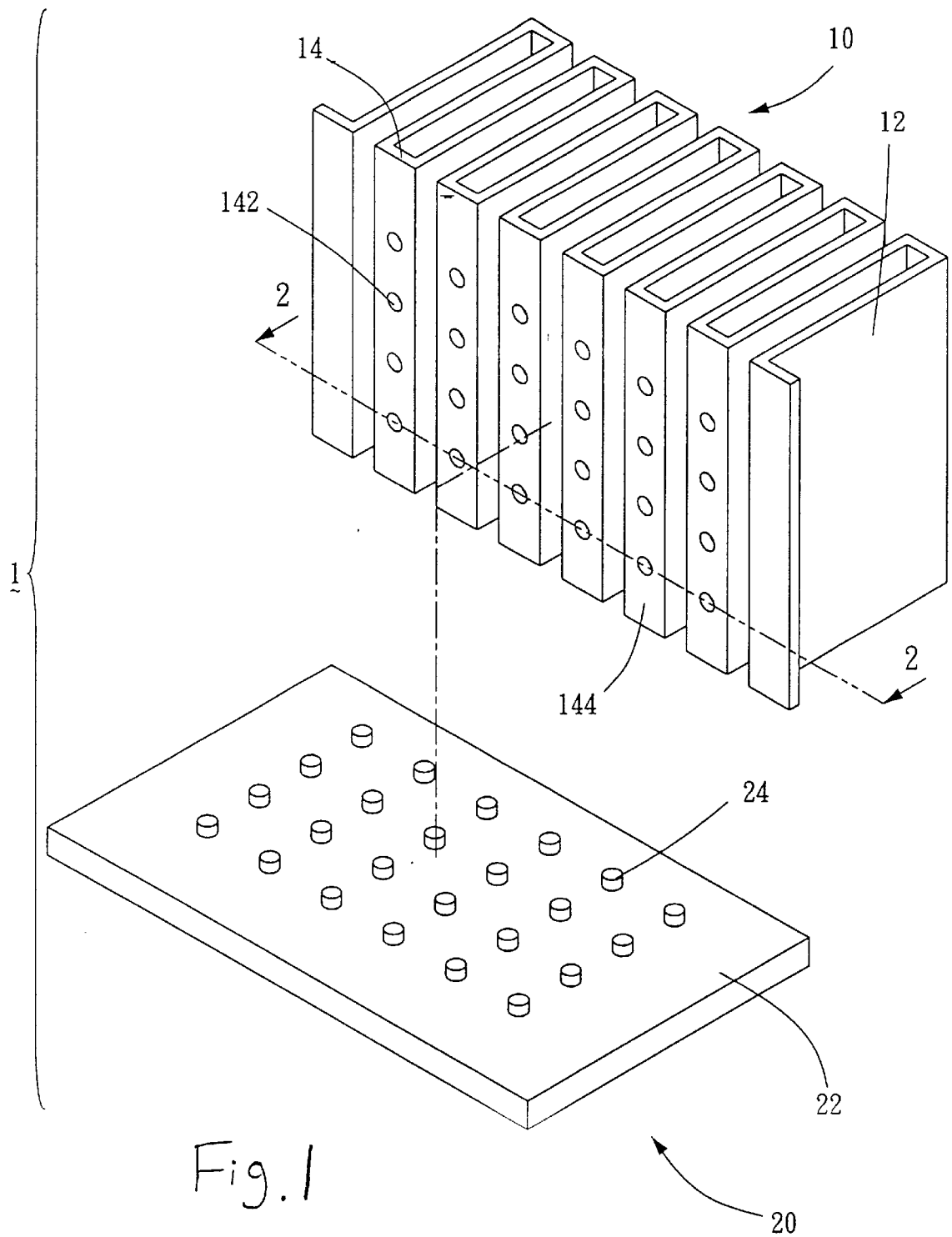
FIG. 1 is an exploded view of a heat dissipating device in accordance with a first embodiment of the present invention.
Figure 2:
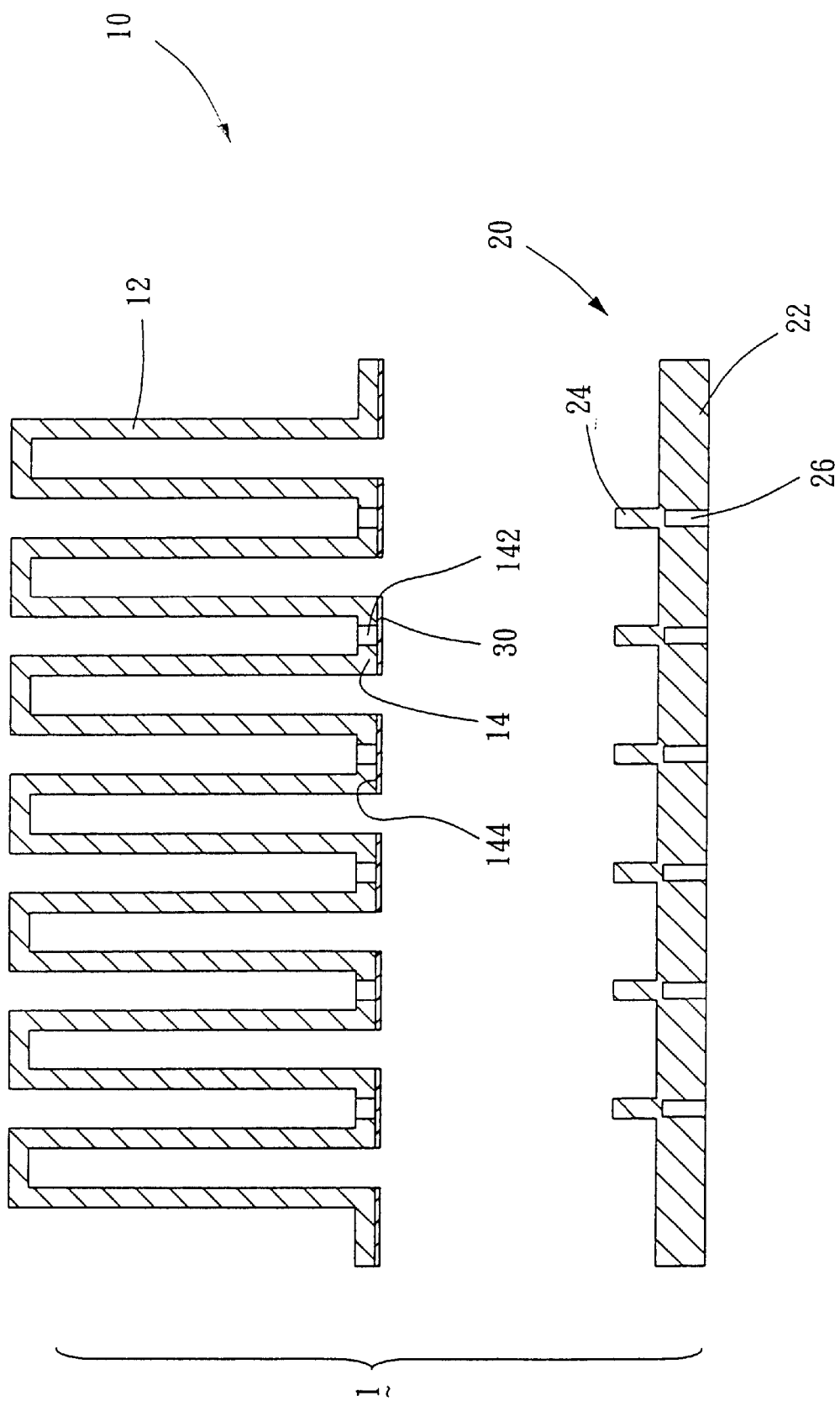
FIG. 2 is a cross-sectional view taken alone line 2—2 of FIG. 1, wherein a bottom of the folded fin is spread with thermal grease.
Figure 3:
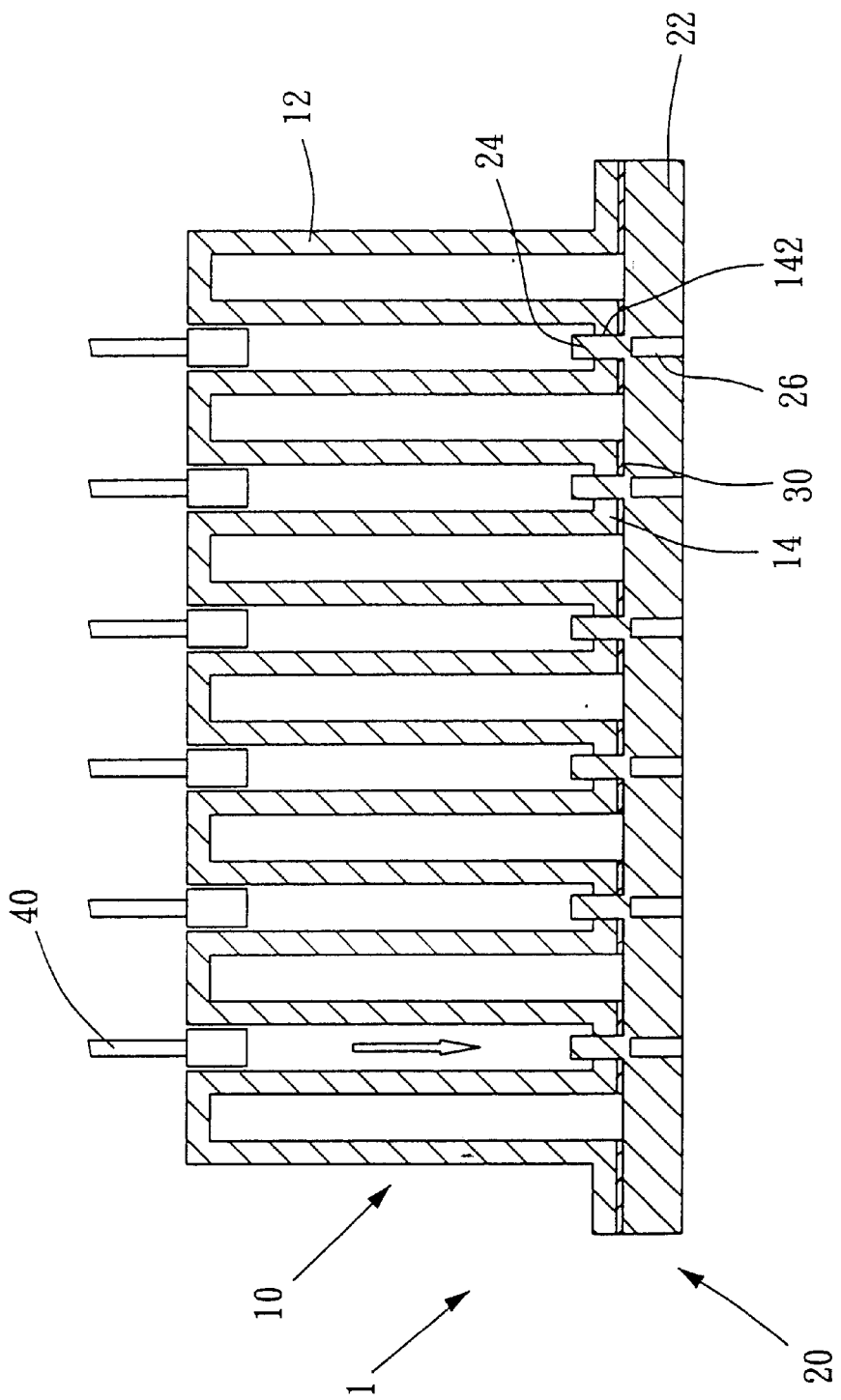
FIG. 3 is view similar to FIG. 2, showing that the folded fin is mounted to the base plate, and a pressing die is going to press studs on the base plate.
Figure 4:
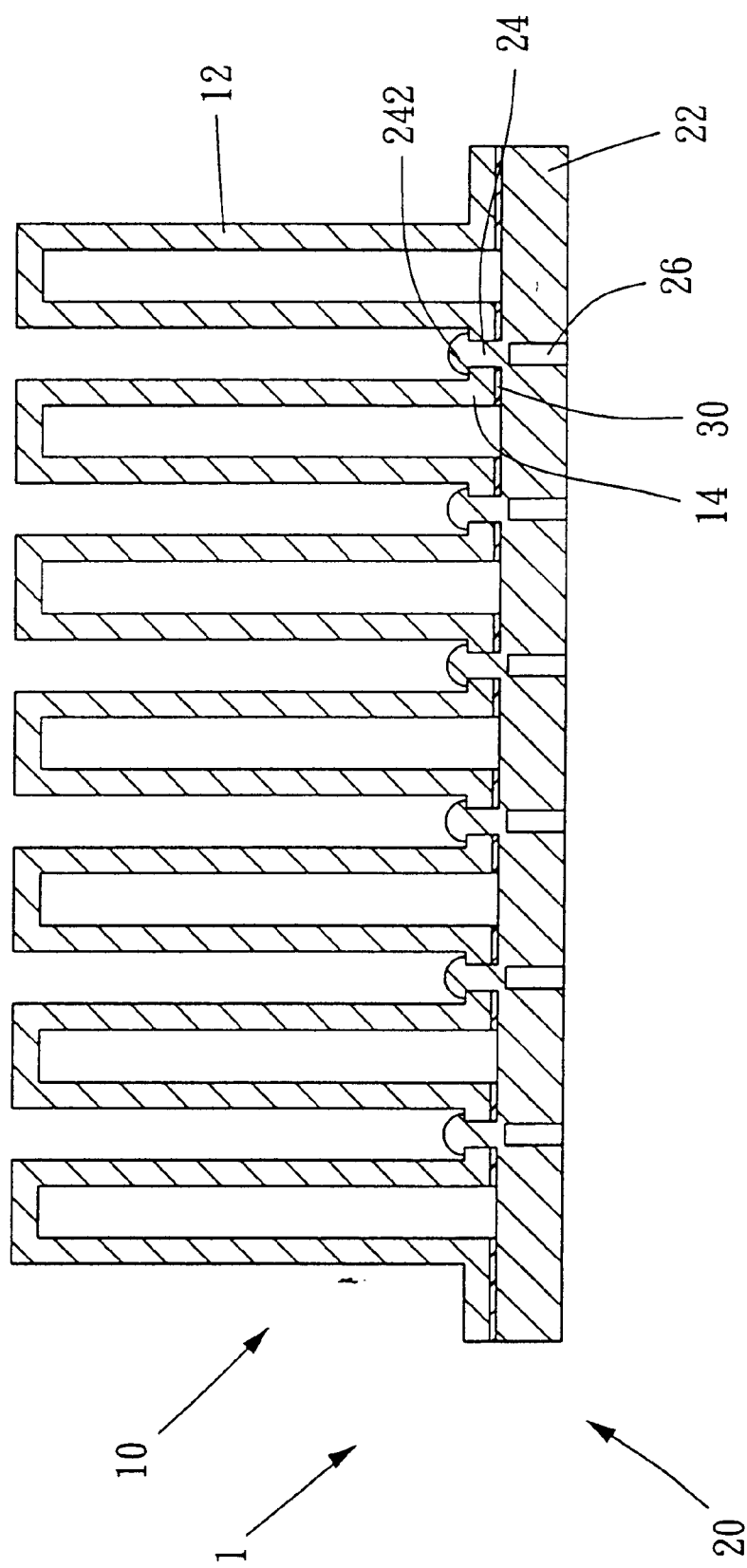
FIG. 4 is a view similar to FIG. 2, showing that the studs are pressed to fixedly connect the folded fin and the base plate together, and thermal grease fills air gaps between the folded fin and the base plate.

Reference will now be made in detail to the preferred embodiments of the present invention.

Referring to FIGS. 1 to 4, a heat dissipating device 1 in accordance with a first embodiment of the present invention includes a folded fin 10 made by bending an aluminum sheet and an aluminum flat base plate 20. The folded fin 10 has a number of inverted U-shaped heat dissipating fins 12 connecting with each other by horizontal bottom partitions 14. Each bottom partition 14 is formed with four holes 142. The base plate 20 has a rectangular main body 22. The main body 22 is pressed to be formed with several columns of studs 24 on a top face thereof. Each column include four studs. Due to the pressing operation for forming the studs 24, a bottom face (not labeled) of the main body 22 is formed with a number of recesses 26 corresponding to the studs 24.

In assembling the folded fin 10 and the base plate 20 to form the heat dissipating device 1, firstly a bottom face 144 of the heat dissipating fins 12 is uniformly spread with a layer of thermal grease 30. Thereafter, the folded fin 10 is brought to be mounted to the base plate 20 in a manner that the studs 24 are fitted through corresponding holes 142. Finally, the heat dissipating device 1 is subject to a pressing operation of a die 40 of a pressing machine, wherein the die 40 moves in a direction as indicated by an arrow of FIG. 3. Thus, a top end of each stud 24 is pressed to be an enlarged head 242 to fixedly connect the folded fin 10 and the base plate 20 together. When the folded fin 10 and the base plate 20 are connected together, any air gap therebetween is filled by the thermal grease 30; thus, the folded fin 10 and the base plate 20 are tightly connected together. Accordingly, heat absorbed by the base plate from a heat source such as a CPU, can be very effectively transmitted to the heat dissipating fins 12 and dissipated to a surrounding environment through the fins 12.

Figure 5:
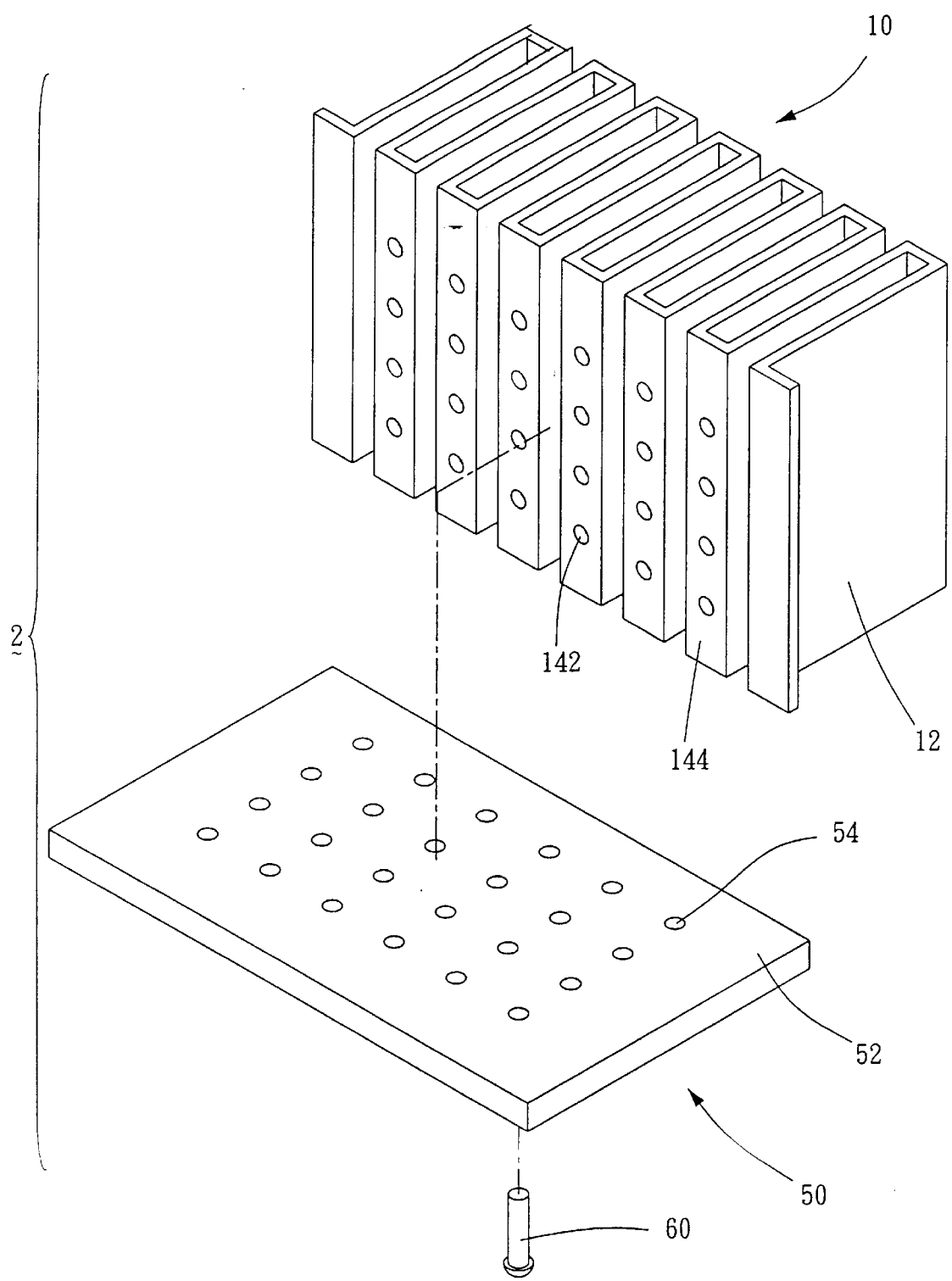
FIG. 5 is an exploded view of a heat dissipating device in accordance with a second embodiment of the present invention.
Figure 6:
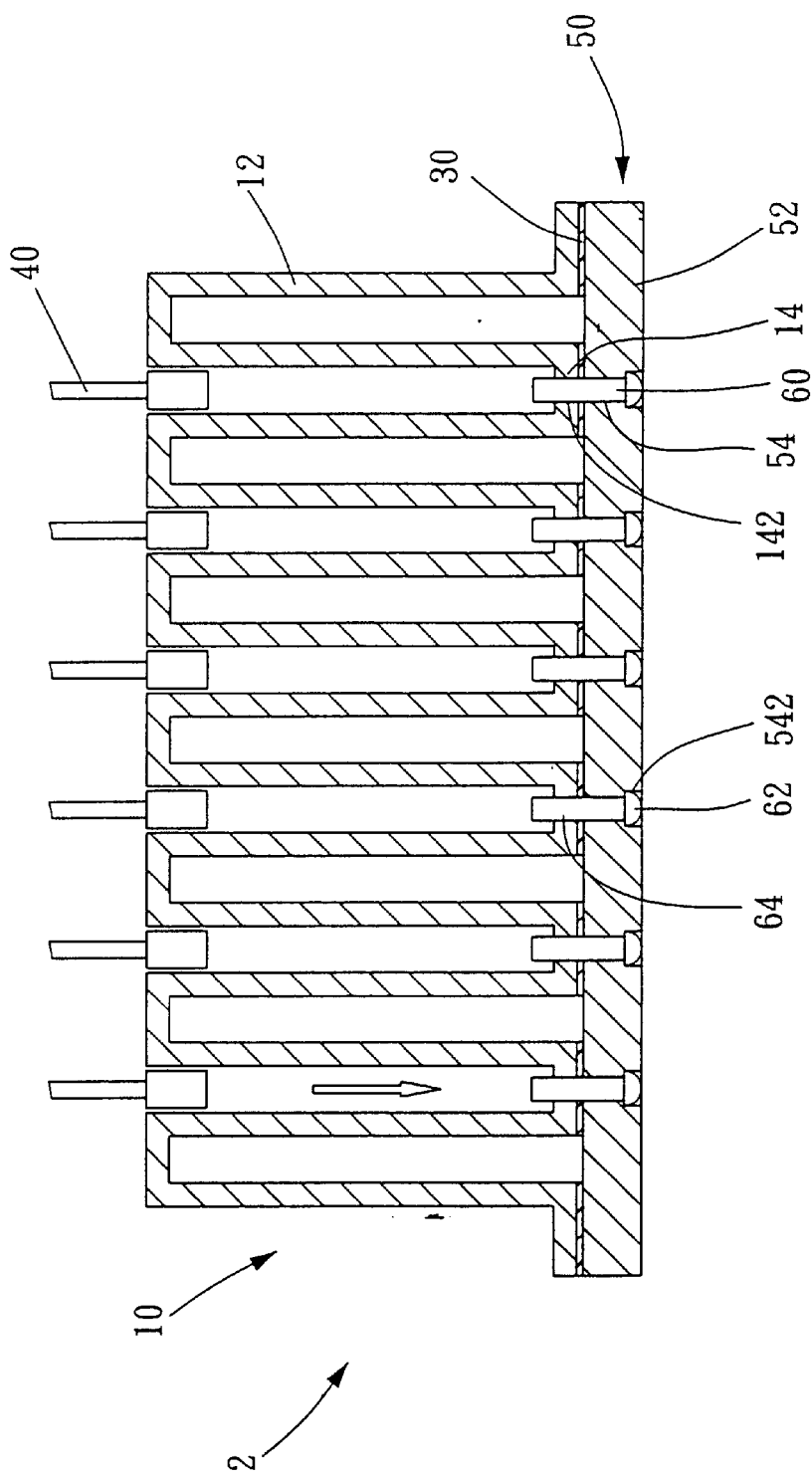
FIG. 6 is a cross-sectional view, showing that a folded fin and rivets are mounted to a base plate and a pressing die is going to press the rivets.
Figure 7:
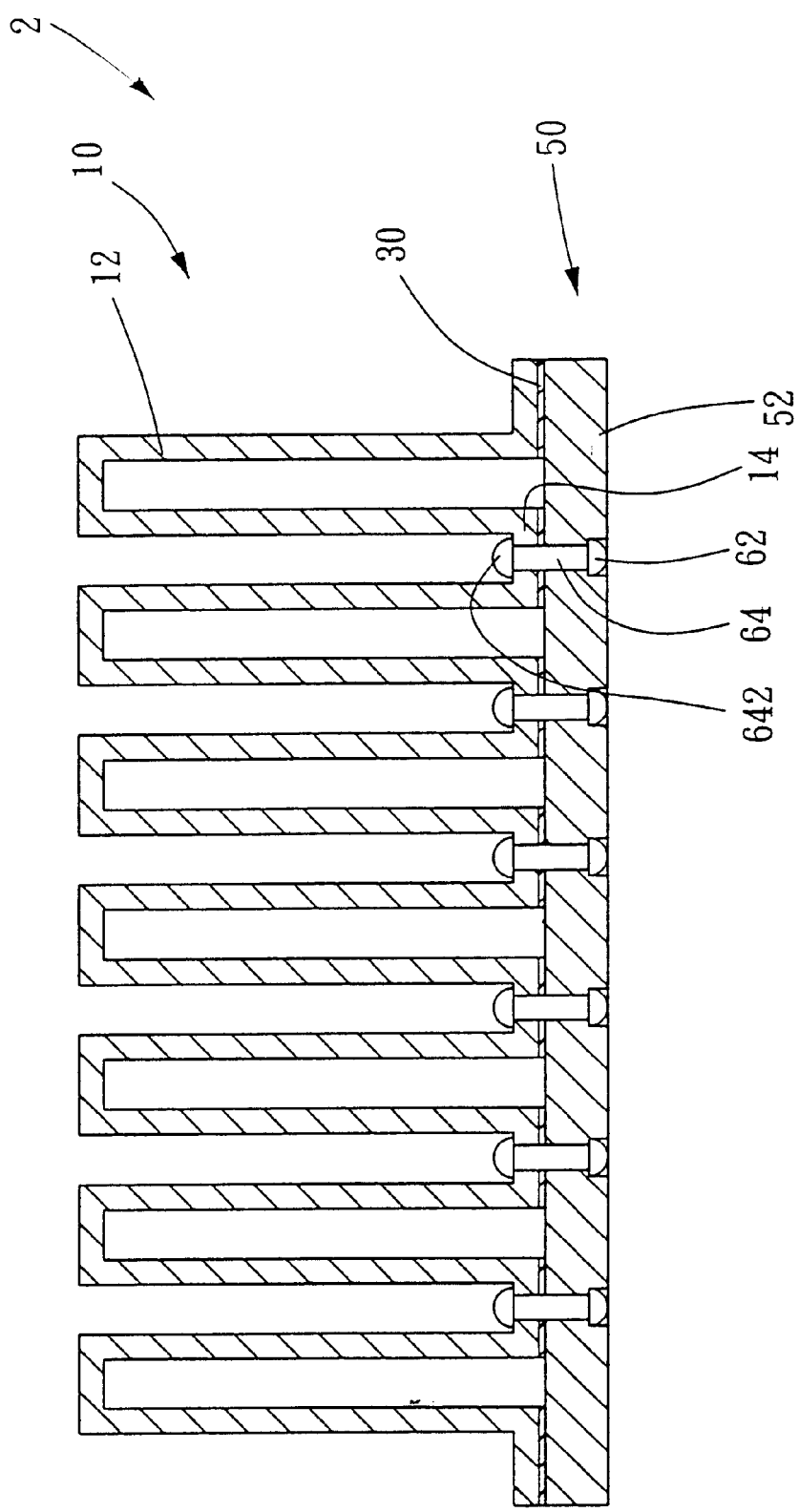
FIG. 7 is a cross-sectional view, showing that the rivets are pressed to fixedly connect the folded fin and the base plate together, and thermal grease fills gaps between the folded fin and the base plate.

FIGS. 5–7 show a heat dissipating device 2 in accordance with a second embodiment of the present invention, which consists of a folded fin 10, a base plate 50 and a number of rivets 60 (only one shown). The folded fin 10 has a configuration the same as the first embodiment; thus, a detailed description thereof is omitted here. The flat base plate 50 is formed with a rectangular main body 50 defining a number of stepped holes 54 therein arranged in six columns. Each column includes four holes. Each stepped hole 54 has a lower portion 542 with a larger size.

In assembling the folded fin 10, the base plate 50 and the rivets 60 together to form the heat dissipating device 2, firstly a bottom face 144 of the folded fin 10 is uniformly spread with a layer of thermal grease 30. The folded fin 10 is then mounted to the base plate 50 and the rivets 60 are brought to fit with the base plate 50 and the folded fin 10, wherein heads 62 of the rivets 60 are received in the lower portions 542 of the stepped holes 54, and shafts 64 of the rivets 60 are extended through upper portions (not labeled) of the stepped holes 54, the thermal grease 30 and the holes 142 of the folded fin 10. Finally, the heat dissipating device 2 is subject to a pressing operating of a die 40 of a pressing machine, wherein the die 40 moves in a direction as indicated by an arrow of FIG. 6. Thus, a top end of each rivet 64 is pressed to be an enlarged head 642 to fixedly connect the folded fin 10 and the base plate 20 together. When the folded fin 10 and the base plate 20 are connected together, any air gap therebetween is filled by the thermal grease 30; thus, the folded fin 10 and the base plate 50 are tightly connected together. Accordingly, heat absorbed by the base plate 50 from a heat source such as a CPU, can be very effectively transmitted to the heat dissipating fins 12 and then dissipated to a surrounding environment through the fins 12.

Figure 8:
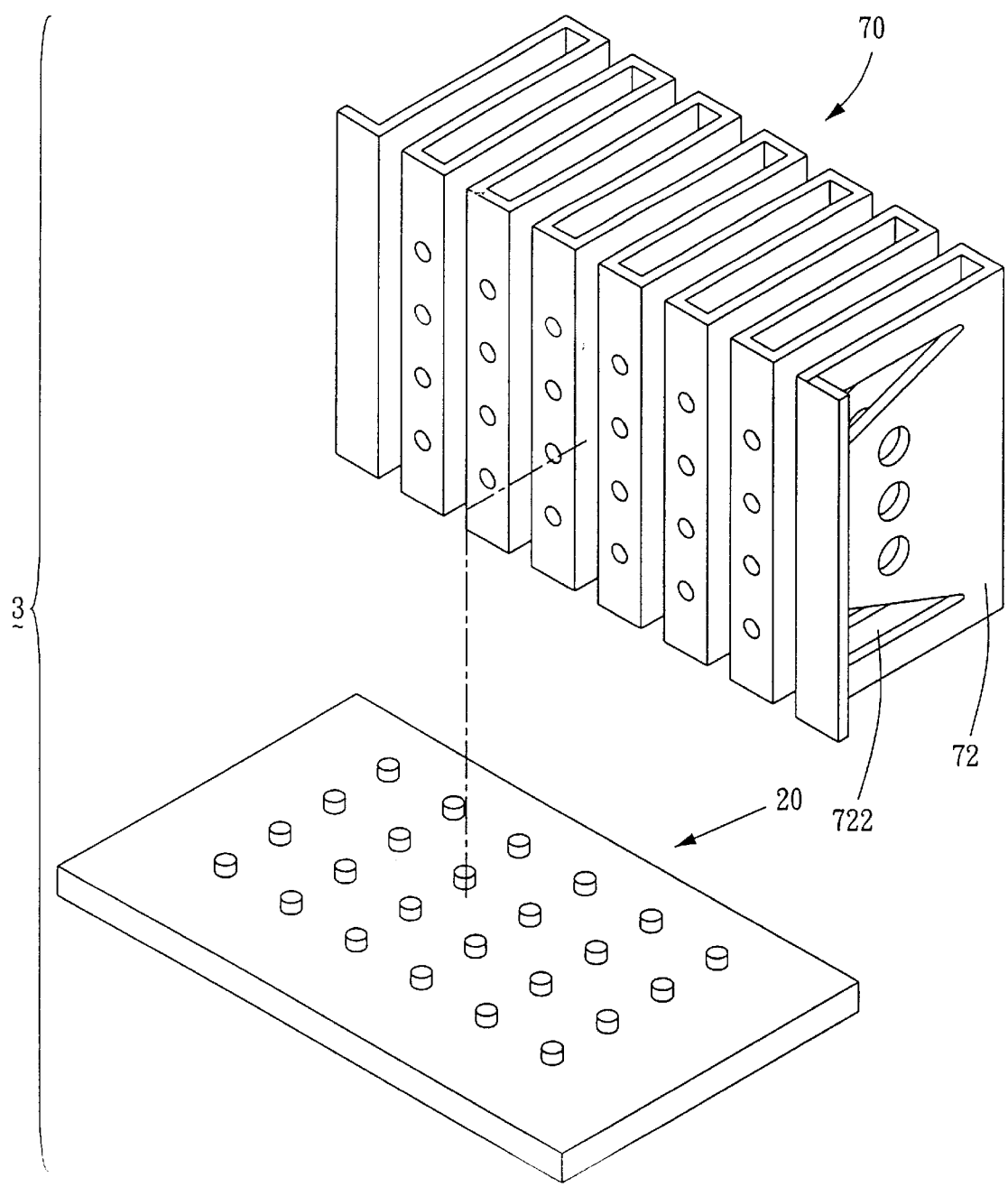
FIG. 8 is an exploded view of a heat dissipating device in accordance with a third embodiment of the present invention.

FIG. 8 shows a heat dissipating device 3 in accordance with a third embodiment of the present invention; except the following differences, the third embodiment is similar to the first embodiment: the third embodiment includes inverted U-shaped heat dissipating fins 70 which are formed with a number of openings 722 therein to increase heat dissipating area thereof. Thus, the heat dissipating device 3 in accordance with the third embodiment has a better heat dissipating effectiveness.

Figure 9:
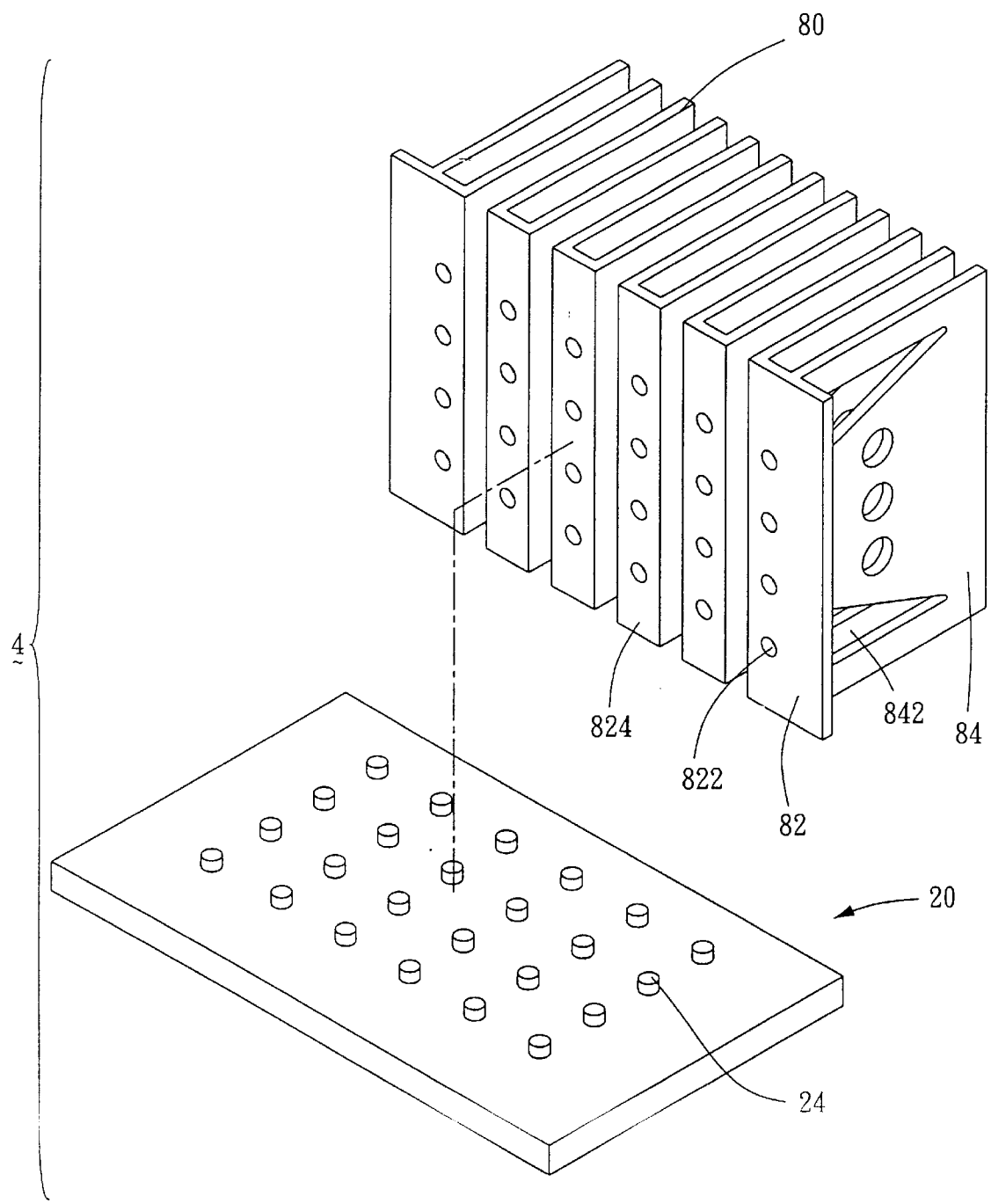
FIG. 9 is an exploded view of a heat dissipating device in accordance with a fourth embodiment of the present invention.

FIG. 9 shows a heat dissipating device 4 in accordance with a fourth embodiment of the present invention, which consists of a flat base plate 20 and six separated folded fins 80 each having a generally U-shaped configuration. The base plate 20 has a configuration the same as the base plate of the first embodiment. Each folded fin 80 has a horizontal lower portion 82 defining four holes 822 therein. Moreover, each folded fin 80 has a pair of heat dissipating plates 84 upright from a corresponding lower portion 82. Each heat dissipating plate 84 defines a number of openings 842 therein for increasing heat dissipating area thereof. In assembling the heat dissipating device 4, firstly a bottom of each folded fin 80 is uniformly spread with a layer of thermal grease (not shown). The folded fins 80 are then successively mounted to the base plate 20 by a manner that studs 24 on the base plate 20 fit through the holes 822 in the lower portion 82. Thereafter, like the first embodiment, the heat dissipating device 4 is subject to a pressing operation by a die of a pressing machine to cause upper ends of the studs 24 to be deformed into enlarged heads thereby fixedly connecting the folded fins 80 and the base plate 20 together. During the pressing operation, the thermal grease fills any air gap possibly existed between the lower portions 82 of the folded fins 80 and the base plate 20 so that the lower portions 82 and the base plate 20 are tightly connected with each other.

While the present invention has been described with reference to specific embodiments, the description is illustrative of the invention and is not to be construed as limiting the invention. Various modifications to the present invention can be made to the preferred embodiments by those skilled in the art without departing from the true spirit and scope of the invention as defined by the appended claims.

We claim:

1. A method for forming a heat dissipating device, comprising the following steps:
    a. providing a base plate with a number of connecting members thereon;
    b. providing a folded fin having a horizontal lower portion defining a number of holes and a heat dissipating portion upright from the lower portion;
    c. mounting the folded fin to the base plate in a manner that the connecting members fit through the holes in the lower portion of the folded fin; and
    d. applying a pressing operation to deform the connecting members to have an enlarged head on respective upper ends thereof for fixedly connecting the folded fin and the base plate together;
    further including a following step between step b and c: spreading a layer of thermal grease on a bottom face of the lower portion of the folded fin wherein when the folded fine is fixedly connected to the base plate, the thermal grease fills air gaps between the lower portion of the folded fin and the base plate.

2. The method in accordance with claim 1, wherein the folded fin comprises a number of inverted U-shaped heat dissipating fins connecting with each other by horizontal bottom partitions, said inverted U-shaped heat dissipating fins constituting the heat dissipating portion of the folded fin, and said bottom partitions constituting the lower portion of the folded fin.

3. The method in accordance with claim 1, wherein the heat dissipating fins each define at least an opening therein for increasing heat dissipating area thereof.

4. The method in accordance with claim 1, wherein the base plate is flat in shape and forms a number of studs constituting the connecting members.

5. A method for forming a heat dissipating device, comprising the following steps:
    a. forming a metal base plate;
    b. forming a metal folded fin having a horizontal bottom plate and a heat dissipating plate upright from the bottom plate;

c. spreading thermal grease on a bottom face of the bottom plates; and d. extending rivets through the base plate and the bottom plate of the folded fin and then pressing the rivets to fixedly connect the folded fin to the base plate by a pressing operation during which the thermal grease fills air gaps between the bottom plate of the folded fin and the base plate to enable heat absorbed by the base plate to be effectively transmitted to the heat dissipating plate and surrounding environment via the heat dissipating plate.

6. The method in accordance with claim 5, wherein the step b further includes to form a number of openings in the upright heat dissipating plate to increase heat dissipating area thereof.

7. A heat dissipating device, comprising:

a base plate integrally formed with a number of studs;

a folded fin having a number of U-shaped heat dissipating plates connecting with each other by bottom partitions, each partition defining a number of holes therein for engagingly receiving the studs of the base plate by pressing the studs to form a respective enlarged head; and thermal grease filling air gaps of a contacting portion between the base plate and the bottom partitions of the folded fin, whereby heat absorbed by the base plate can be effectively transmitted to the heat dissipating plate and a surrounding environment via the heat dissipating plate.

8. The heat dissipating device in accordance with claim 7, wherein the U-shaped heat dissipating plates are formed with a number of opening therein to increase heat dissipating area thereof.

9. The heat dissipating device in accordance with claim 7, wherein the base plate is formed with a number of recesses below the studs.

10. The heat dissipating device in accordance with claim 7, wherein the folded fin consists of a number of separated generally U-shaped heat dissipating plates, each plate having a horizontal bottom portion defining a number of holes therein, and a heat dissipating portion upright from the bottom portion, the base plate being integrally formed with a number of studs extending through the holes in the bottom portion of each U-shaped heat dissipating plate and being pressed to form enlarged heads thereby fixedly connecting the folded fin and the base plate together.

11. A heat dissipating device, comprising:

a metal base plate integrally forming a number of studs; and a metal extending fin having a horizontal bottom portion defining a number of holes, a heat dissipating portion upright from the bottom portion, the studs fitting through the holes and being pressed to form enlarged heads to fixedly connect the base plate and the folded fin together; wherein air gaps between the base plate and the bottom portion of the extending fin are filled with thermal grease.

12. The heat dissipating device in accordance with claim 11, wherein the upright heat dissipating portion is formed with several openings to increase heat dissipating area.

13. A heat dissipating device, comprising:

a base plate defining a number of stepped holes therein;

a folded fin comprising a number of inverted U-shaped heat dissipating plates connecting with each other by bottom partitions, each partition defining a number of holes, a number of rivets each having an enlarged end embedded into a corresponding stepped hole, and a shaft fitting through a corresponding hole in a corresponding partition, an end of each shaft being pressed into an enlarged head to fixedly connect the folded fin and the base plate together; thermal grease filling air gaps of a contacting portion between the base plate and the bottom partitions of the folded fin.

* * * * *